United States Patent
Kano

(10) Patent No.: US 11,271,568 B2
(45) Date of Patent: Mar. 8, 2022

(54) FREQUENCY DIVIDER CIRCUIT, COMMUNICATION CIRCUIT, AND INTEGRATED CIRCUIT

(71) Applicant: SOCIONEXT INC., Kanagawa (JP)

(72) Inventor: Hideki Kano, Kanagawa (JP)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 17/118,331

(22) Filed: Dec. 10, 2020

(65) Prior Publication Data

US 2021/0091768 A1 Mar. 25, 2021

Related U.S. Application Data

(63) Continuation of application No. PCT/JP2018/022660, filed on Jun. 14, 2018.

(51) Int. Cl.
*H03K 23/00* (2006.01)
*H03K 19/17736* (2020.01)
(Continued)

(52) U.S. Cl.
CPC ....... *H03K 19/1774* (2013.01); *H03K 19/096* (2013.01); *H03K 21/023* (2013.01);
(Continued)

(58) Field of Classification Search
None
See application file for complete search history.

(56) References Cited

U.S. PATENT DOCUMENTS 4,727,541 A * 2/1988 Mori ................. H04L 5/22
370/535
6,201,418 B1 * 3/2001 Allmon ............ H03K 3/356139
327/52
(Continued)

FOREIGN PATENT DOCUMENTS

JP 2003-318726 A 11/2003
JP 2013-219543 A 10/2013

OTHER PUBLICATIONS

International Search Report issued in corresponding International Patent Application No. PCT/JP2018/022860, dated Jul. 17, 2018, with English translation.
(Continued)

*Primary Examiner* — Tuan T Lam
(74) *Attorney, Agent, or Firm* — McDermott Will & Emery LLP

(57) ABSTRACT

A frequency divider circuit includes: a first latch circuit that including: a pair of input transistors each having a gate thereof configured to connect to a signal line to which a first voltage is supplied; and a pair of output nodes, and configured to receive a single-phase clock signal; and a second latch circuit of SR-type, the second latch circuit having a set input thereof and a reset input thereof configured to connect to the pair of output nodes of the first latch circuit, and configured to output differential clock signals of which frequency is half a frequency of the single-phase clock signal. The first latch circuit is configured to perform amplification and reset operations alternately repeatedly in response to the single-phase clock signal.

20 Claims, 4 Drawing Sheets

(51) Int. Cl.
*H03K 19/096* (2006.01)
*H03K 21/02* (2006.01)
*H03K 21/10* (2006.01)
*H03K 23/58* (2006.01)
*H03K 23/60* (2006.01)

(52) U.S. Cl.
CPC ............ *H03K 21/10* (2013.01); *H03K 23/58* (2013.01); *H03K 23/60* (2013.01)

(56) References Cited

U.S. PATENT DOCUMENTS

| | | | | |
|---|---|---|---|---|
| 6,366,113 | B1* | 4/2002 | Song | H03K 3/356139 326/24 |
| 6,573,775 | B2* | 6/2003 | Pilling | H03K 3/356139 327/202 |
| 6,707,321 | B2* | 3/2004 | Cho | G11C 7/062 327/51 |
| 6,714,053 | B2* | 3/2004 | Mohan | H03K 3/012 327/217 |
| 7,479,818 | B2* | 1/2009 | Park | G11C 7/065 327/218 |
| 7,778,374 | B2* | 8/2010 | Jeon | H04L 25/0292 375/372 |
| 2002/0024368 | A1* | 2/2002 | Kim | H03K 3/037 327/199 |
| 2003/0201800 | A1* | 10/2003 | Matsuo | H03M 9/00 327/57 |
| 2006/0146882 | A1* | 7/2006 | Kim | H04B 1/71 370/485 |
| 2007/0252630 | A1 | 11/2007 | Sumesaglam | |
| 2009/0196312 | A1* | 8/2009 | Kuroda | H04J 3/047 370/503 |
| 2013/0266055 | A1 | 10/2013 | Matsumoto et al. | |
| 2015/0029876 | A1* | 1/2015 | Ogata | H04J 3/047 370/252 |
| 2016/0142059 | A1 | 5/2016 | Chakraborty | |
| 2017/0040983 | A1 | 2/2017 | Chen et al. | |
| 2017/0085403 | A1 | 3/2017 | Sun et al. | |

OTHER PUBLICATIONS

Japanese Office Action issued in corresponding Japanese Patent Application No. 2020-525023 dated Jan. 18, 2022, with English translation.

* cited by examiner

F I G. 1
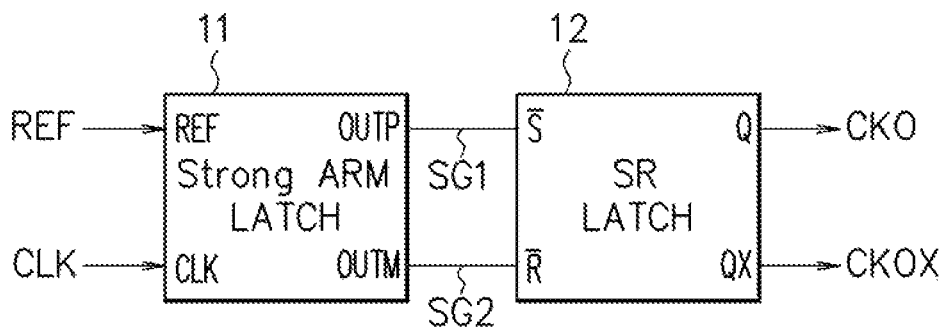
F I G. 2
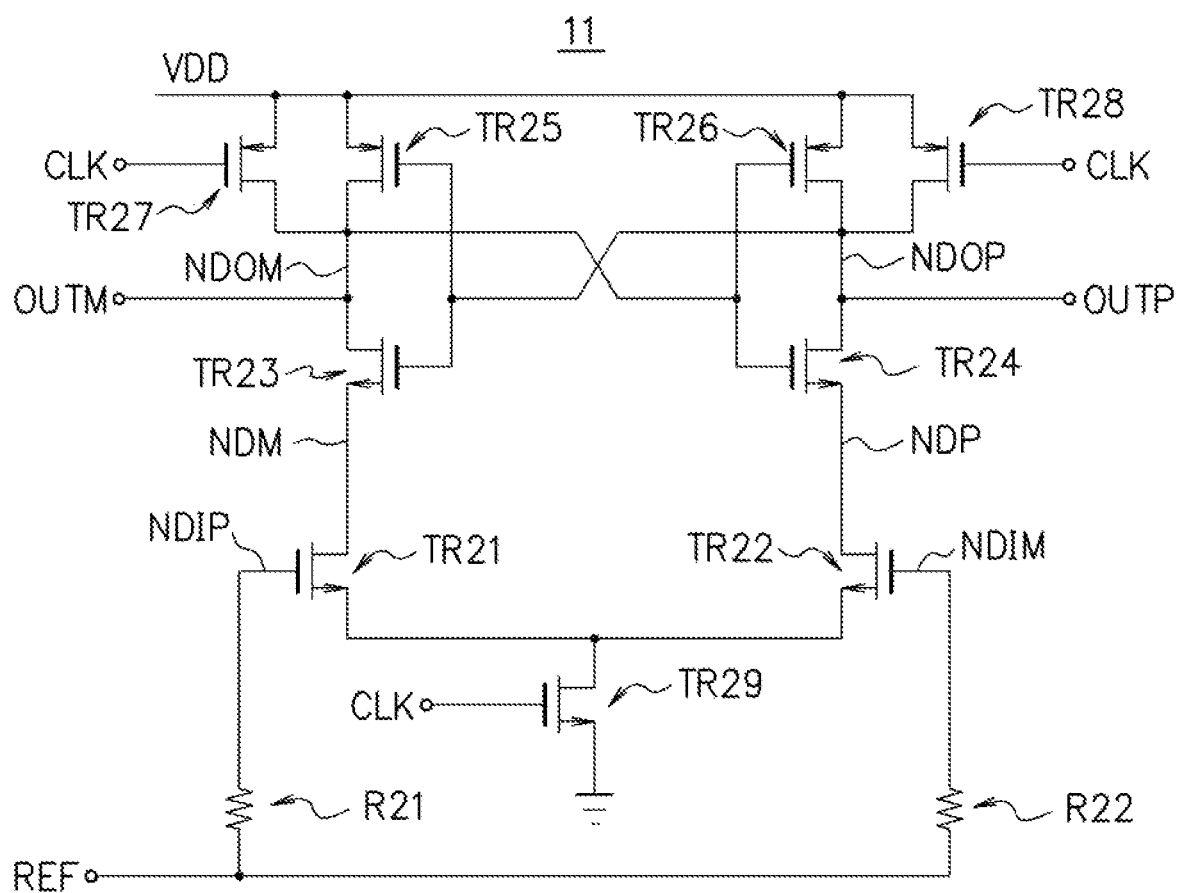

F I G. 5
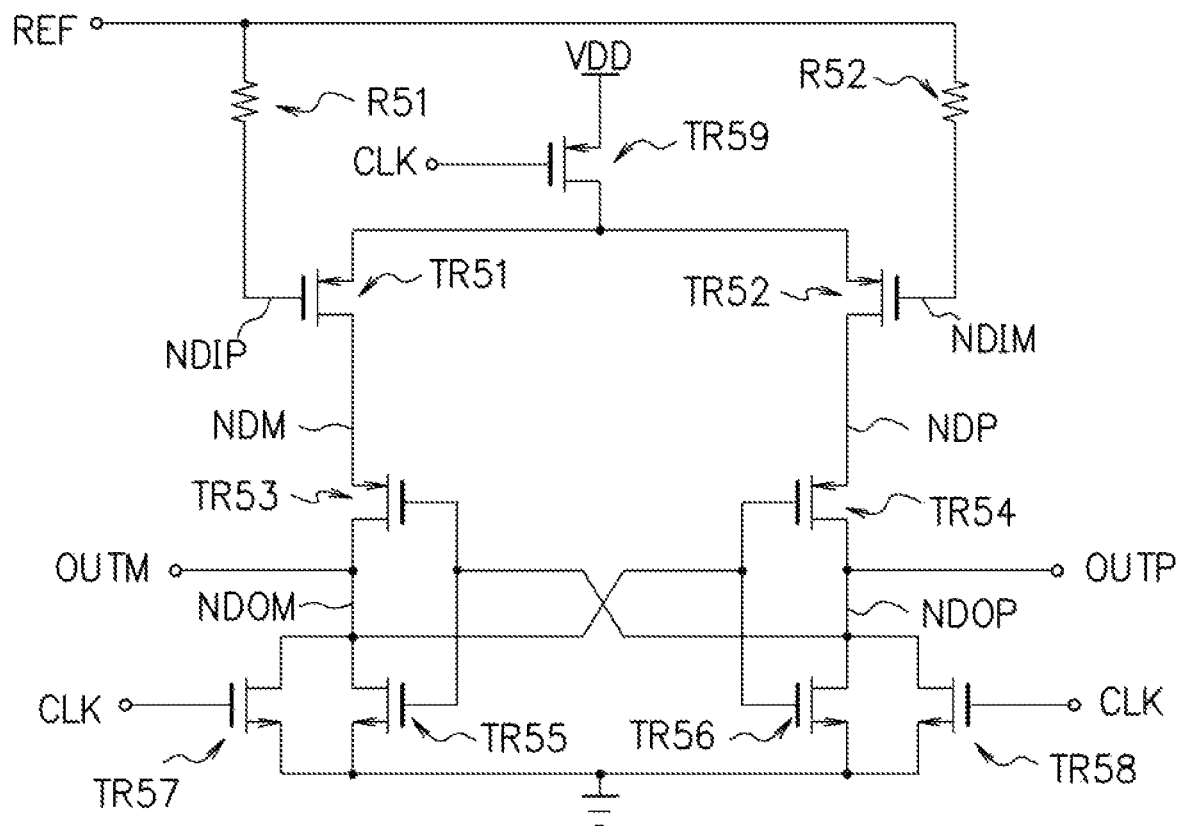

US 11,271,568 B2

FREQUENCY DIVIDER CIRCUIT, COMMUNICATION CIRCUIT, AND INTEGRATED CIRCUIT

CROSS-REFERENCE TO RELATED APPLICATION

This application is a continuation application of International Application PCT/JP2018/022660, filed on Jun. 14, 2018, and designated the U.S., the entire contents of which are incorporated herein by reference.

FIELD

The embodiment discussed herein is directed to a frequency divider circuit, a communication circuit, and an integrated circuit.

BACKGROUND

A frequency divider circuit that divides the frequency of a clock signal is generally configured using flip-flops. Further, in high speed interfaces with high operating frequencies, such as a serializer/de-serializer (SerDes), differential clock signals are used. The frequency divider circuit can output frequency-divided differential clock signals by dividing the frequency of a single-phase clock signal using flip-flops and further generating an inverted signal using an inverter, or the like in the case of low frequencies.

In the meantime, in the case of high frequencies, the delay caused by the inverter, or the like relative to a period becomes large relatively, so that the frequency divider circuit is often configured to receive differential clock signals, divide the frequency of them, and output the frequency-divided differential clock signals. However, when differential flip-flops are used to divide the frequency of a pair of signals in the differential clock signals, the power consumption is almost doubled and it is not easy to meet timing constraints such as aligning the timing of the differential signals. When the frequency divider circuit using the flip-flops is used to receive differential clock signals and output the frequency-divided differential clock signals, such a problem arises.

A strong arm (Strong ARM) type latch circuit that alternately performs amplification and reset (precharge) operations repeatedly in response to an input clock signal has been known (see Patent Documents 1, 2, for example).

[Patent Document 1] U.S. Patent Application Publication No. 2017/0085403

[Patent Document 2] U.S. Patent Application Publication No. 2017/0040983

SUMMARY

One aspect of the frequency divider circuit includes: a first latch circuit, the first latch circuit including: a pair of input transistors each having a gate thereof configured to connect to a signal line to which a first voltage is supplied; and a pair of output nodes, the first latch circuit configured to receive a single-phase clock signal; and a second latch circuit of SR-type, the second latch circuit having a set input thereof and a reset input thereof configured to connect to the pair of output nodes of the first latch circuit, and configured to output differential clock signals of which frequency is half a frequency of the single-phase clock signal. The first latch circuit is configured to perform amplification and reset operations alternately repeatedly in response to the single-phase clock signal, and configured not to reset nodes to which drains of the pair of input transistors are connected in the reset operation.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of a frequency divider circuit in an embodiment.

FIG. 2 is a diagram illustrating a configuration example of a strong arm type latch circuit in this embodiment.

FIG. 5 is a diagram illustrating another configuration example of the strong arm type latch circuit in this embodiment.

DESCRIPTION OF EMBODIMENT

Figure 3:
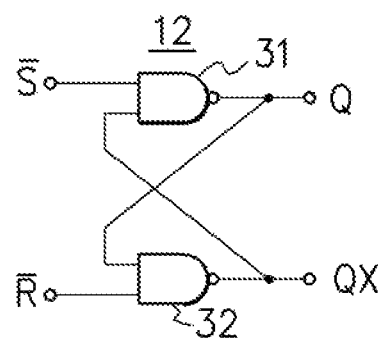
FIG. 3 is a diagram illustrating a configuration example of a SR latch circuit this embodiment.

An Embodiment will be explained based on the drawings below.

A strong arm (Strong ARM) type latch circuit is a circuit that alternately performs amplification and reset (precharge) operations repeatedly in response to an input clock signal. The strong arm type latch circuit has a property, in which the strong arm type latch circuit tends to output data opposite to the previously output data at the time of amplification if the strong arm type latch circuit does not properly reset each node in the circuit by providing a reset circuit, or the like.

In the embodiment to be explained below, the output of the strong arm type latch circuit is toggled to achieve the function as a frequency divider circuit by taking advantage of the fact that it is easy to output data that are opposite to the previously output data. FIG. 1 is a diagram illustrating a configuration example of the frequency divider circuit in one embodiment. The frequency divider circuit in this embodiment includes a strong arm type latch circuit 11 and a SR (Set-Reset) latch circuit 12.

The strong arm type latch circuit 11 receives a certain reference voltage REF through a reference voltage input terminal (REF) and receives a single-phase clock signal CLK through a clock input terminal (CLK). The strong arm type latch circuit 11 outputs a signal SG1 through a first data output terminal (OUTP: a positive-phase data output terminal) and outputs a signal SG2 through a second data output terminal (OUTM: a negative-phase data output terminal).

Here, in the strong arm type latch circuit 11 in this embodiment, the reference voltage input terminal (REF) corresponds to positive-phase and negative-phase data input terminals (INP, INM) in a normal strong arm type latch circuit. The reference voltage REF is a direct-current voltage, and is, for example, {(a high electric potential VDD of a power supply voltage)−0.2} V in this example.

The strong arm type latch circuit 11 performs amplification and reset (precharge) operations repeatedly alternately in response to the clock signal CLK input through the clock input terminal (CLK). The strong arm type latch circuit 11 enters an amplification period when the input clock signal CLK is at a high level, and enters a reset (precharge) period when the input clock signal CLK is at a low level.

The SR latch circuit 12 receives the signal SG1 output from the strong arm type latch circuit 11 through a set input terminal (/S, an inverting input), and receives the signal SG2 output from the strong arm type latch circuit 11 through a reset input terminal (/R, an inverting input). The SR latch circuit 12 outputs a pair of clock signals CKO, CKOX, which are differential clock signals, from data output terminals (Q, QX). This embodiment is set to output the clock signal CKO, which is one of the differential clock signals, from the first data output terminal (Q) and output the clock signal CKOX, which is the other of the differential clock signals, from the second data output terminal (QX).

The SR latch circuit 12 outputs, from the data output terminals (Q, QX), signals in response to the signal SG1 input through the set input terminal (/S, the inverting input) and the signal SG2 input through the reset input terminal (/R, the inverting input). The SR latch circuit 12 holds the outputs from the data output terminals (Q, QX) when the signals SG1 and SG2 both are at a high level. When the signal SG1 is at a low level and the signal SG2 is at a high level, the SR latch circuit 12 turns the signal CKO to output from the first data output terminal (Q) to a high level and turns the signal CKOX to output from the second data output terminal (QX) to a low level. When the signal SG1 is at a high level and the signal SG2 is at a low level, the SR latch circuit 12 turns the signal CKO to output from the first data output terminal (Q) to a low level and turns the signal CKOX to output from the second data output terminal (QX) to a high level.

FIG. 2 is a diagram illustrating a configuration example of the strong arm type latch circuit 11 in this embodiment. The strong arm type latch circuit 11 in this embodiment includes N-channel type transistors TR21, TR22, TR23, TR24, and TR29, P-channel type transistors TR25, TR26, TR27, and TR28, and resistors R21, R22.

The N-channel type transistors TR21, TR22 are a pair of input transistors in the strong arm type latch circuit 11, The N-channel type transistor TR21 has a source thereof connected to a drain of the N-channel type transistor TR29, has a gate thereof connected to a signal line to which the reference voltage REF is supplied via the resistor R21, and has a drain thereof connected to a source of the N-channel type transistor T23. The N-channel type transistor TR22 has a source thereof connected to the drain of the N-channel type transistor TR29, has a gate thereof connected to the signal line to which the reference voltage REF is supplied via the resistor R22, and has a drain thereof connected to a source of the N-channel type transistor TR24.

As above, to the strong arm type latch circuit 11 in this embodiment, not differential data, but the same reference voltage REF is input as an input corresponding to a normal data input. Here, the resistors R21, R22 each have a high resistance value so that impedances of nodes NDIP, NDIM to which the gates of the transistors TR21, TR22 are connected increase sufficiently.

The P-channel type transistor T25 has a source thereof connected to a power supply line to which a first electric potential (the high electric potential VDD of the power supply voltage) is supplied and has a drain thereof connected to a drain of the N-channel type transistor TR23. The P-channel type transistor TR26 has a source thereof connected to the power supply line to which the first electric potential (the high electric potential VDD of the power supply voltage) is supplied and has a drain thereof connected to a drain of the N-channel type transistor TR24. A gate of the N-channel type transistor TR23 and a gate of the P-channel type transistor TR25 are connected to a connection point (an output node NDOP) between the drain of the N-channel type transistor TR24 and the drain of the P-channel type transistor TR26. A gate of the N-channel type transistor TR24 and a gate of the P-channel type transistor TR26 are connected to a connection point (an output node NDOM) between the drain of the N-channel type transistor TR23 and the drain of the P-channel type transistor TR25.

That is, a first inverter configured by the N-channel type transistor TR23 and the P-channel type transistor TR25 and a second inverter configured by the N-channel type transistor TR24 and the P-channel type transistor TR26 are cross-connected so that an input end on one side and an output end on the other side are connected.

The connection point (the output node NDOM) between the drain of the N-channel type transistor TR23 and the drain of the P-channel type transistor TR25 is connected to the second data output terminal (OUTM: negative-phase data output terminal). The connection point (the output node NDOP) between the drain of the N-channel type transistor TR24 and the drain of the P-channel type transistor TR26 is connected to the first data output terminal (OUTP: positive-phase data output terminal).

The P-channel type transistor TR27 has a source thereof connected to the power supply line to which the first electric potential (the high electric potential VDD of the power supply voltage) is supplied, has a gate thereof connected to the clock input terminal (CLK), and has a drain thereof connected to the connection point (the output node NDOM) between the drain of the N-channel type transistor TR23 and the drain of the P-channel type transistor TR25. The P-channel type transistor TR28 has a source thereof connected to the power supply line to which the first electric potential (the high electric potential VOD of the power supply voltage) is supplied, has a gate thereof connected to the clock input terminal (CLK), and has a drain thereof connected to the connection point (the output node NDOP) between the drain of the N-channel type transistor TR24 and the drain of the P-channel type transistor TR26.

The transistors TR27, TR28 are on/off controlled in response to the clock signal CLK to be input to the gates, and are turned off in the amplification period and are turned on in the reset period to operate so as to turn the electric potentials of the output nodes NDOP, NDOM to the first electric potential. That is, the transistors TR27, TR28 reset (precharge) the electric potentials of the output nodes NDOP, NDOM to the first electric potential (the high electric potential VDD of the power supply voltage) in the reset period.

The N-channel type transistor TR29, which has the drain thereof to which the sources of the transistors TR21, TR22 are connected, has the source thereof connected to a power supply line to which a second electric potential (a low electric potential of the power supply voltage, for example, ground) is supplied and has the gate thereof connected to the clock input terminal (CLK). The N-channel type transistor TR29 is on/off controlled in response to the clock signal CLK to be input to the gate, and is turned off in the reset period and is turned on in the amplification period to operate as a current source.

Incidentally, a general strong arm type latch circuit includes a reset circuit intended for resetting (precharging) nodes to which drains of input transistors are connected (nodes corresponding to the nodes NDP, NDM illustrated in FIG. 2) to a certain electric potential. In contrast to this, in the strong arm type latch circuit 11 in this embodiment, the circuit intended for resetting (precharging) the nodes NDP, NDM is not provided, in order to retain the previous amplification result without resetting the nodes NDP, NDM.

FIG. 3 is a diagram illustrating a configuration example of the SR latch circuit 12 in this embodiment. The SR latch circuit 12 in this embodiment includes negative logical product operation circuits (NAND circuits) 31, 32. The NAND circuit 31 has a first input end thereof connected to the set input terminal (/S, the inverting input) and has a second input end thereof connected to an output end of the NAND circuit 32. The NAND circuit 32 has a first input end thereof connected to the reset input terminal (/R, the inverting input) and has a second input end thereof connected to an output end of the NAND circuit 31. The output end of the NAND circuit 31 is connected to the first data output terminal (Q), and the output end of the NAND circuit 32 is connected to the second data output terminal (QX).

Figure 4:
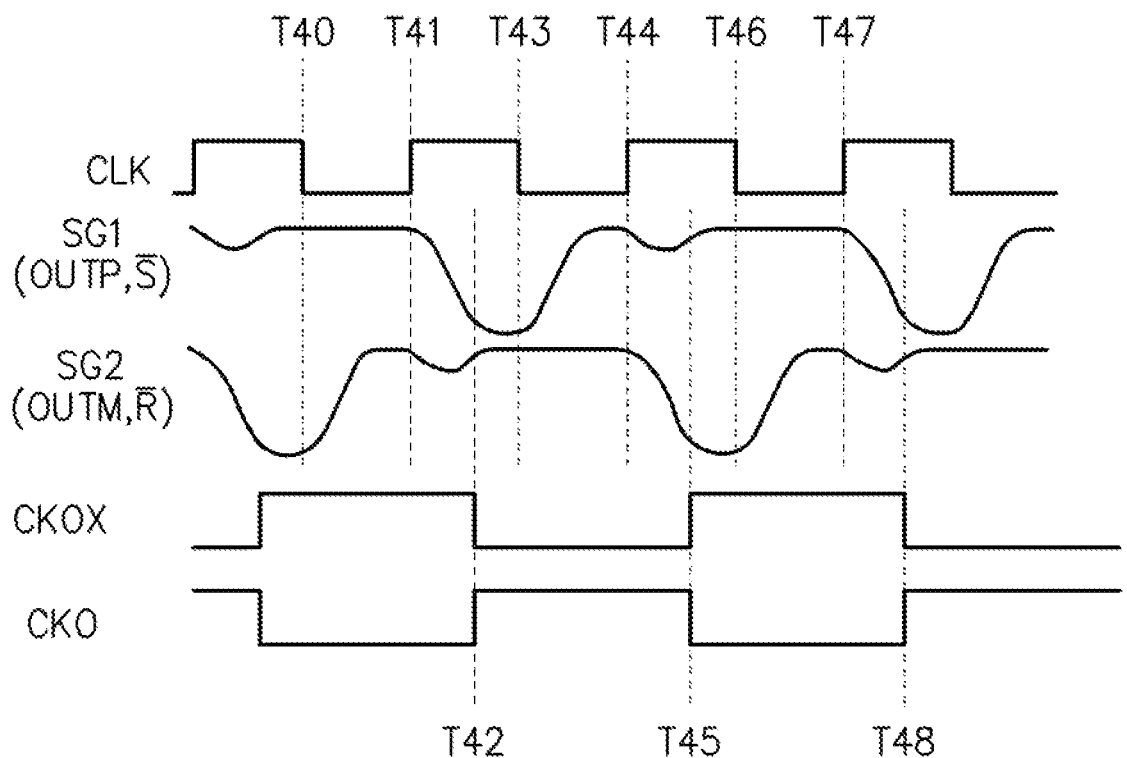
FIG. 4 is a timing chart that explains the operation of the frequency divider circuit in this embodiment.

Next, the operation of the frequency divider circuit in this embodiment will be explained. FIG. 4 is a timing chart that explains the operation of the frequency divider circuit in this embodiment. When the input single-phase clock signal CLK is at a high level, the strong arm type latch circuit 11 is in the amplification period, the transistors TR27, TR28 are turned off, and the transistor TR29 is turned on. When the input single-phase clock signal CLK is at a low level, the strong arm type latch circuit 11 is in the reset (precharge) period, the transistors TR27, TR28 are turned on, and the transistor TR29 is turned off.

When the clock signal CLK changes to a low level from a high level at a time T40 where as for the signals SG1, SG2 output from the strong arm type latch circuit 11, the electric potential of the signal SG1 is higher than that of the signal SG2, namely, the electric potential of the output node NDOP is in a state higher than the electric potential of the output node NDOM in the strong arm type latch circuit 11, the strong arm type latch circuit 11 enters the reset period. In the strong arm type latch circuit 11 in the reset period, the transistors TR27, TR28 are turned on and the transistor TR29 is turned off. Thus, the output nodes NDOM, NDOP are connected to the power supply line to which the first electric potential (the high electric potential VDD of the power supply voltage) is supplied via the transistors TR27, TR28.

At the point of the time T40, the transistor TR23 is on and the transistor T24 is off, and thus, the node NDM is precharged earlier than the node NDP. Thereafter, the output node NDOM turns to a high level, and thereby the transistor TR24 is turned on and the node NDP is precharged. In the amplification period before this reset period (before the time T40), the electric potential of the node NDP is lower than that of the node NDM, and thus, when the node NDP is precharged, the amount by which the node NDIM is increased to a high electric potential through a gate-to-drain capacitance of the transistor TR22 is large, causing the electric potential of the node NDIM (the gate of the transistor TR22) to be higher than that of the node NDIP (the gate of the transistor TR21). That is, the magnitude relationship of the input electric potential is inverted between the node NDIM (the gate of the transistor TR22) and the node NDIP (the gate of the transistor TR21) in the period before this reset period.

Incidentally, in the reset period since the time T40, the electric potential of the signal SG2 output from the strong arm type latch circuit 11 rises and a logic level of the signal SG2 turns to a high level from a low level. However, since the signals SG1 and SG2 output from the strong arm type latch circuit 11 are both at a high level, the SR latch circuit 12 holds the outputs and continues to output a low level as the clock signal CKO in the differential clock signals, and continues to output a high level as the clock signal CKOX in the differential clock signals.

Then, when the clock signal CLK changes to a high level from a low level at the time T40 in a state where the electric potential of the node NDIM (the gate of the transistor TR22) is higher than that of the node NDIP (the gate of the transistor TR21) in the strong arm type latch circuit 11, the strong arm type latch circuit 11 enters the amplification period. In the strong arm type latch circuit 11 in the amplification period, the transistors TR27, TR28 are turned off and the transistor TR29 is turned on. Then, the difference in electric potential between the gates of the transistors TR21 and TR22, which are the input transistors, is amplified.

At a time T41, since the electric potential of the node NDIM (the gate of the transistor TR22) is higher than that of the node NDIP (the gate of the transistor TR21), the electric potential of the output node NDOP, namely, the electric potential of the signal SG1 output from the strong arm type latch circuit 11 goes down in the amplification period. Then, at the time T41, the logic level of the signal SG1 output from the strong arm type latch circuit 11 turns to a low level from a high level. Thereby, the signal SG1 turns to a low level and the signal SG2 tunes to a high level, the signals SG1, SG2 being output from the strong arm type latch circuit 11, and thus, the SR latch circuit 12 outputs a high level as the clock signal CKO in the differential clock signals and outputs a low level as the clock signal CKOX in the differential clock signals.

When the clock signal CLK changes to a low level from a high level at a time T43, which is a state where the electric potential of the signal SG2 is higher than that of the signal SG1, namely, the electric potential of the output node NDOM is higher than that of the output node NDOP in the strong arm type latch circuit 11, the strong arm type latch circuit 11 enters the reset period again. At the time T43, since the transistor TR23 is off and the transistor TR24 is on, the node NDP is precharged earlier than the node NDM, and thereafter, the transistor TR23 is turned on and the node NDM is precharged. Since the electric potential of the node NDM is lower than that of the node NDP in the amplification period before this reset period, when the node NDM is precharged, the amount by which the node NDIP is increased to a high electric potential through a gate-to-drain capacitance of the transistor TR21 is large, causing the electric potential of the node NDIP (the gate of the transistor TR21) to be higher than the electric potential of the node NDIM (the gate of the transistor TR22). Also in this reset period, the magnitude relationship of the input electric potential is inverted between the node NDIP (the gate of the transistor TR21) and the node NDIM (the gate of the transistor TR22) in the period before the reset period.

Incidentally, in the reset period since the time T43, the signal SG1 output from the strong arm type latch circuit 11 rises to be a high level from a low level. However, since the signals SG1 and SG2 output from the strong arm type latch circuit 11 are both at a high level, the SR latch circuit 12 continues to output a high level as the clock signal CKO in the differential clock signals, and continues to output a low level as the clock signal CKOX in the differential clock signals.

Then, when the clock signal CLK changes to a high level from a low level at a time T44 in a state where the electric potential of the node NDIP (the gate of the transistor TR21)

is higher than that of the node NDIM (the gate of the transistor T22) in the strong arm type latch circuit 11, the strong arm type latch circuit 11 enters the amplification period again.

At the time T44, since the electric potential of the node NDIP (the gate of the transistor TR21) is higher than that of the node NDIM (the gate of the transistor TR22), in the amplification period, the output node whose logic level changes from the previous amplification period is switched, and the electric potential of the output node NDOM, namely, the electric potential of the signal SG2 output from the strong-arm type latch circuit 11 goes down. Then, when the signal SG1 turns to a high level and the signal SG2 turns to a low level, the signals SG1, SG2 being output from the strong arm type latch circuit 11, at a time T45, the SR latch circuit 12 outputs a low level as the clock signal CKO in the differential clock signals and outputs a high level as the clock signal CKOX in the differential clock signals.

Then, when the clock signal CLK changes to a low level from a high level at a time T46 in a state where the electric potential of the signal SG1 is higher than that of the signal SG2 again, namely, the electric potential of the output node NDOP is higher than that of the output node NDOM in the strong arm type latch circuit 11, the strong arm type latch circuit 11 enters the reset period. In this reset period, in the same manner as in the reset period since the time T40, the electric potential of the node NDIM (the gate of the transistor T22) becomes higher than that of the node NDIP (the gate of the transistor TR21).

When the clock signal CLK changes to a high level from a low level at a time T47 in a state where the electric potential of the node NDIM (the gate of the transistor TR22) higher than that of the node NDIP (the gate of the transistor T21), the strong arm type latch circuit 11 enters the amplification period. In this amplification period, in the same manner as in the amplification period since the time T41, the electric potential of the output node NDOP, namely, the electric potential of the signal SG1 output from the strong arm type latch circuit 11 goes down. Then, when the signal SG1 turns to a low level and the signal SG2 turns to a high level, the signals SG1, SG2 being output from the strong arm type latch circuit 11, at a time T48, the SR latch circuit 12 outputs a high level as the clock signal CKO in the differential clock signals and outputs a low level as the clock signal CKOX in the differential clock signals.

As above, in the frequency divider circuit in this embodiment, every time the strong arm type latch circuit 11 performs reset operation, the magnitude relationship of the electric potentials input to the gates of the transistors TR21 and TR22 as a pair of input transistors is inverted between the gates, and thereby the output node that changes to a different logic level is switched at the time of amplification. Thereby, the frequency divider circuit in this embodiment generates and outputs the differential clock signals CKO, CKOX of half the frequency based on the input single-phase clock signal CLK. The frequency divider circuit in this embodiment generates differential clock signals of half the frequency based on a single-phase clock signal without receiving differential clock signals, thereby being able to generate highly accurate frequency-divided differential clock signals of high frequency with a simple circuit configuration without increasing the power consumption.

Here, in the frequency divider circuit in this embodiment, the frequency dividing operation is achieved by taking advantage of the fact that a difference in electric potential, which is opposite to the previous one, is created between the node NDIP (the gate of the transistor TR21) and the node NDIM (the gate of the transistor TR22) in the reset period in the strong arm type latch circuit 11. Therefore, when the frequency of the clock signal CLK is too low, the reset period is prolonged and the difference in electric potential between the node NDIP (the gate of the transistor TR21) and the node NDIM (the gate of the transistor TR22) disappears, failing to perform a normal frequency dividing operation.

The lower limit of the frequency at which this frequency dividing operation is possible is determined by time constants of the input transistors TR21, TR22 in the strong arm type latch circuit 11, namely, by resistance values of the resistors R21, R22 and capacitance values of gate capacitances of the transistors TR21, TR22. For example, in the case where the resistance values of the resistors R21, R22 are 10 kohm and the capacitance values of the gate capacitances of the transistors TR21, TR22 are 10 fF, the lower limit value of the frequency at which the frequency dividing operation is possible becomes 1.59 GHz. Further, for example, when the resistance values of the resistors R21, R22 are 100 kohm and the capacitances are connected to the gates of the transistors TR21, TR22 and the capacitance values are 100 fF, the lower limit value of the frequency at which the frequency dividing operation is possible becomes 15.9 GHz.

Incidentally, in the frequency divider circuit in this embodiment, the upper limit of the target clock signal is related to a current gain cut-off frequency fT, which is one of the indicators indicating the high frequency performance of the transistor. Here, the current gain cut-off frequency fT can be found from the condition where Gain becomes one. By Iout=gm×Vin, Zout=1/(jωC), Vout=Zout×Iout=Zout× gm×Vin, and Gain=Vout/Vin=Zout×gm=gm/(jωC)>1, fT<gm/(2πC) is established. Therefore, as the current gain cut-off frequency fT that is found from the condition where Gain becomes one, fT=gm/(2πC) is established. In practice, there is a parasitic capacitance of a wiring and a gain of 2 dB or more is needed in a practical way, and thus, if the process technology is 16 nm FF, the upper limit of the clock signal targeted by the frequency divider circuit in this embodiment is about 15 GHz.

Incidentally, in the previous explanation, as the strong arm type latch circuit included in the frequency divider circuit, the strong arm type latch circuit including the N-channel type transistors TR21, TR22 set as a pair of input transistors has been explained as one example, but it is also possible to employ a configuration using a strong arm type latch circuit including P-channel type transistors TR51, TR52 set as a pair of input transistors as illustrated in FIG. 5.

FIG. 5 is a diagram illustrating another configuration example of the strong arm type latch circuit in this embodiment. The strong arm type latch circuit illustrated in FIG. 5 includes P-channel type transistors TR51, TR52, TR53, TR54, and TR59, N-channel type transistors TR55, TR56, TR57, and TR58, and resistors R51, R52.

The P-channel type transistor TR51 has a source thereof connected to a drain of the P-channel type transistor TR59, has a gate thereof connected to a reference voltage input terminal (RFF) via the resistor R51 having a sufficiently large resistance value, and has a drain thereof connected to a source of the P-channel type transistor TR53. The P-channel type transistor TR52 has a source thereof connected to the drain of the P-channel type transistor TR59, has a gate thereof connected to the reference voltage input terminal (REF) via the resistor R52 having a sufficiently large resistance value, and has a drain thereof connected to a source of the P-channel type transistor TR54.

The N-channel type transistor T55 has a source thereof connected to a power supply line to which a first electric potential (a low electric potential of a power supply voltage, for example, ground) is supplied and has a drain thereof connected to a drain of the P-channel type transistor TR53. The N-channel type transistor TR56 has a source thereof connected to the power supply line to which the first electric potential (the low electric potential of the power supply voltage, for example, ground) is supplied and has a drain thereof connected to a drain of the P-channel type transistor TR54. A gate of the P-channel type transistor TR53 and a gate of the N-channel type transistor TR55 are connected to a connection point (an output node NDOP) between the drain of the P-channel type transistor TR54 and the drain of the N-channel type transistor TR56. A gate of the P-channel type transistor TR54 and a gate of the N-channel type transistor TR56 are connected to a connection point (an output node NDOM) between the drain of the P-channel type transistor TR53 and the drain of the N-channel type transistor TR55. That is, a first inverter configured by the P-channel type transistor TR53 and the N-channel type transistor TR55 and a second inverter configured by the P-channel type transistor. TR54 and the N-channel type transistor TR56 are cross-connected.

The connection point (the output node NDOM) between the drain of the P-channel type transistor TR53 and the drain of the N-channel type transistor TR55 is connected to a second data output terminal (OUTM: a negative-phase data output terminal). The connection point (the output node NDOP) between the drain of the P-channel type transistor TR54 and the drain of the N-channel type transistor TR56 is connected to a first data output terminal (OUTP: a positive-phase data output terminal).

The N-channel type transistor TR57 has a source thereof connected to the power supply line to which the first electric potential (the low electric potential of the power supply voltage, for example, ground) is supplied, has a gate thereof connected to a clock input terminal (CLK), and has a drain thereof connected to the connection point (the output node NDOM) between the drain of the P-channel type transistor TR53 and the drain of the N-channel type transistor TR55. The N-channel type transistor TR58 has a source thereof connected to the power supply line to which the first electric potential (the low electric potential of the power supply voltage, for example, ground) is supplied, has a gate thereof connected to the clock input terminal (CLK), and has a drain thereof connected to the connection point (the output node NDOP) between the drain of the P-channel type transistor TR54 and the drain of the N-channel type transistor TR56.

The transistors TR57, TR58 are on/off controlled in response to the clock signal CLK to be input to the gates, and are turned off in the amplification period and are turned on in the reset period to operate so as to turn the electric potentials of the output nodes NDOP, NDOM to the first electric potential. That is, the transistors TR57, TR58 reset (precharge) the electric potentials of the output nodes NDOP, NDOM to the first electric potential (the low electric potential of the power supply voltage, for example, ground) in the reset period.

The P-channel type transistor TR59, which has the drain thereof to which the sources of the transistors TR51, TR52 are connected, has the source thereof connected to a power supply line to which a second electric potential (a high electric potential VDD of the power supply voltage) is supplied and has the gate thereof connected to the clock input terminal (CLK). The P-channel type transistor TR59 is on/off controlled in response to the clock signal CLK to be input to the gate, and is turned off in the reset period and is turned on in the amplification period to operate as a current source. Incidentally, the strong arm type Latch circuit illustrated in FIG. 5 enters the amplification period when the clock signal CLK is at a low level, and enters the reset (precharge) period when the clock signal CLK is at a high level.

Further, in the previous explanation, the example where the SR latch circuit 12 is configured by using the NAND circuits 31, 32 has been described, but this embodiment is not limited to this and a SR latch circuit with an arbitrary circuit configuration is applicable. Further, the circuit is not limited to the SR latch circuit, but may be such a circuit as to latch an output signal in the amplification period of the strong arm type latch circuit and shape a waveform and output the resultant.

Figure 6:
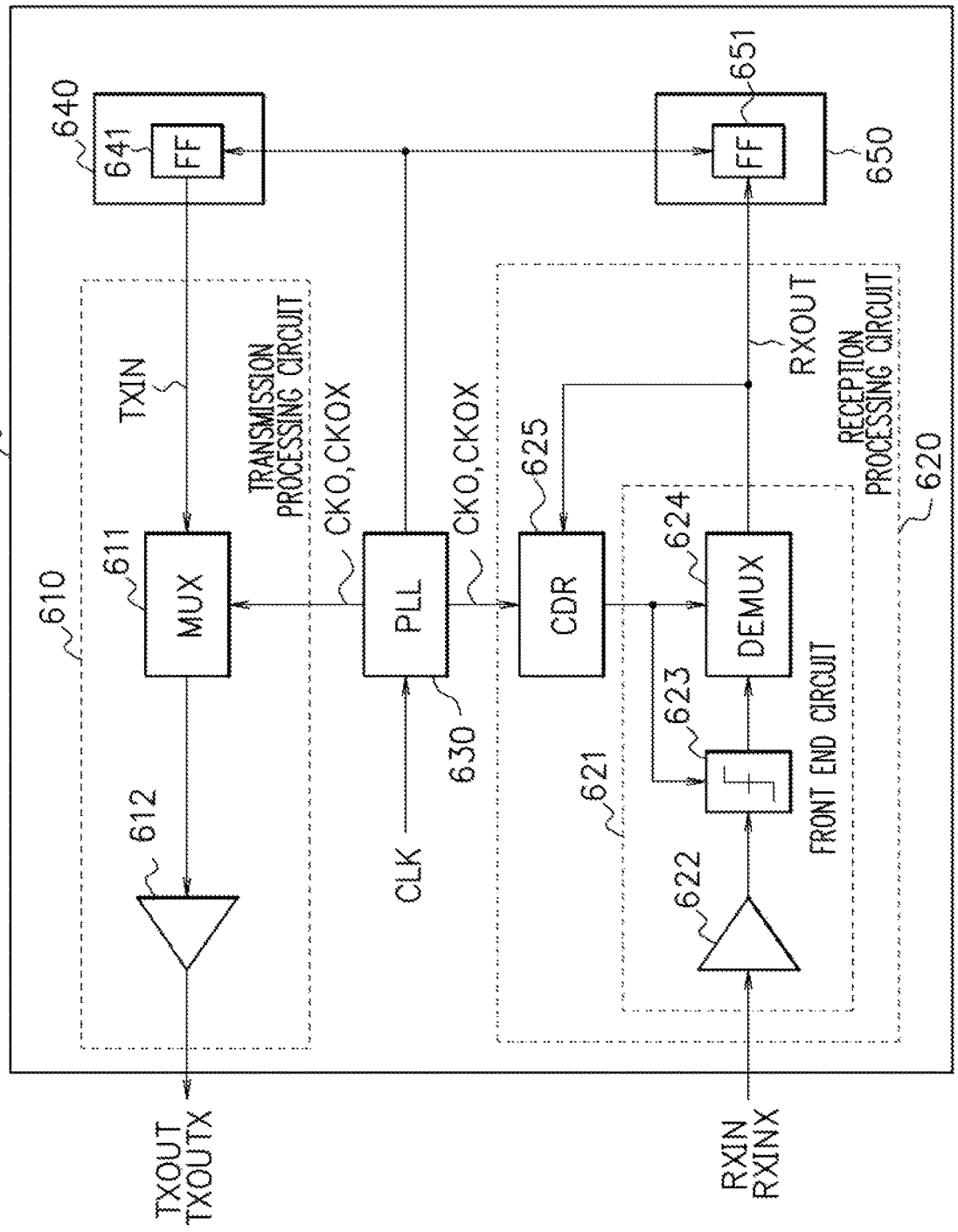
FIG. 6 is a diagram illustrating a configuration example of an integrated circuit in this embodiment.

FIG. 6 is a diagram illustrating a configuration example of an integrated circuit in this embodiment. An integrated circuit 600 in this embodiment includes a transmission processing circuit 610, a reception processing circuit 620, a phase locked loop (PLL) circuit 630, and signal processing circuits 640, 650.

The transmission processing circuit 610 includes a multiplexer 611 and an equalizer circuit 612. The multiplexer 611 uses the differential clock signals CKO, CKOX supplied from the PLL circuit 630 to convert a parallel signal TXIN output from the signal processing circuit 640 into a serial signal. The equalizer circuit 612 shapes a voltage waveform of the serial signal output from the multiplexer 611 to output differential output serial signals TXOUT, TXOUTX. That is, the signal processing circuit 610 has a function of a serializer circuit and converts an input parallel signal into a serial signal to output it.

The reception processing circuit 620 includes a front end circuit 621 and a clock data recovery (CDR) circuit 625 and achieves a function of a deserializer circuit that converts an input serial signal into a parallel signal. The front end circuit 621 includes an equalizer circuit 622, a determination circuit 623, and a demultiplexer 624.

The equalizer circuit 622 receives differential input serial signals RXIN, RXINX transmitted through a transmission path, or the like. The determination circuit 623 uses multiphase clock signals supplied from the CDR circuit 625 to determine codes (data) of the input serial signals received in the equalizer circuit 622. The demultiplexer 624 converts an output from the determination circuit 623 into a parallel signal RXOUT to output it. The CDR circuit 625 appropriately controls the phases of the differential clock signals CKO, CKOX output from the PLL circuit based on the parallel signal RXOUT received from the demultiplexer 624, to thereby generate the above-described multiphase clocks.

The PLL circuit 630 includes the previously described frequency divider circuit in this embodiment. The PLL circuit 630 generates the clock signals to be supplied to the respective circuits 610, 620, 640, and 650 in the integrated circuit to output them based on the input single-phase clock signal CLK. The PLL circuit 630 generates the differential clock signals CKO, CKOX of half the frequency based on the input single-phase clock signal CLK, for example, to output them.

The signal processing circuit 640 performs processing relating to the signal to output to the transmission processing circuit 610 and outputs the parallel signal TXIN to the transmission processing circuit 610 by a flip-flop 641 to operate by the clock signals to be supplied from the PLL circuit 630. The signal processing circuit 650 includes a logic circuit, or the like that performs processing in response to the reception of the parallel signal RXOUT from the reception processing circuit 620. The signal processing circuit 650 performs taking-in processing, or the like on the parallel signal RXOUT output from the reception processing circuit 620 by a flip-flop 651 to operate by the clock signals to be supplied from the PLL circuit 630.

In FIG. 6, the integrated circuit having both the transmission function and the reception function has been described as an example, but the integrated circuit in this embodiment may have only one of the transmission function and the reception function.

Further, the aforementioned embodiment merely illustrates one concrete example of implementing the present invention, and the technical scope of the present invention is not to be construed in a restrictive manner by the embodiment. That is, the present invention may be implemented in various forms without departing from the technical spirit or main features thereof.

The disclosed frequency divider circuit is capable of generating highly accurate frequency-divided differential clock signals of high frequency without receiving differential clock signals.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

According to the embodiment, it is possible to provide a frequency divider circuit capable of generating highly accurate frequency-divided differential clock signals of high frequency with a simple circuit configuration without receiving differential clock signals.

What is claimed is:

1. A frequency divider circuit, comprising:
a first latch circuit, the first latch circuit including:
a pair of input transistors each having a gate thereof configured to connect to a signal line to which a first voltage is supplied; and
a pair of output nodes,
the first latch circuit configured to receive a single-phase clock signal; and
a second latch circuit of SR-type, the second latch circuit having a set input thereof configured to connect to one output node of the pair of output nodes, having a reset input thereof configured to connect to the other output node of the pair of output nodes, and configured to output differential clock signals of which frequency is half a frequency of the single-phase clock signal, wherein
the first latch circuit is configured to perform amplification and reset operations alternately repeatedly in response to the single-phase clock signal, and configured not to reset nodes to which drains of the pair of input transistors are connected in the reset operation.

2. The frequency divider circuit according to claim 1, wherein
the first latch circuit includes a pair of inverters which are cross-connected, each of the pair of inverters including two transistors, a source of one transistor of the two transistors being connected to a drain of the input transistor, and
the pair of output nodes are connected to outputs of the pair of inverters, and the first latch circuit is configured to reset the pair of output nodes in the reset operation.

3. The frequency divider circuit according to claim 1, wherein
the first latch circuit
performs the amplification operation when the single-phase clock signal is at one level of a high level and a low level, and
performs the reset operation when the clock signal is at the other level of a high level and a low level.

4. The frequency divider circuit according to claim 3, wherein
every time the first latch circuit performs the reset operation, a magnitude relationship of an electric potential to be input to the gates of the pair of input transistors is inverted between the gates of the pair of input transistors.

5. The frequency divider circuit according to claim 3, wherein
every time the first latch circuit performs the reset operation, the output node to change to a different logic level in the amplification operation is switched between the pair of output nodes.

6. The frequency divider circuit according to claim 1, wherein
the first latch circuit is a strong arm type latch circuit.

7. A communication circuit, comprising:
a frequency divider circuit configured to receive a single-phase clock signal and output differential clock signals of which frequency is half a frequency of the single-phase clock signal; and
a transmission processing circuit, the transmission processing circuit including:
a multiplexer configured to use the differential clock signals supplied from the frequency divider circuit and convert a parallel signal into a serial signal,
the transmission processing circuit configured to convert an input parallel signal into a serial signal and transmit the serial signal, wherein
the frequency divider circuit includes:
a first latch circuit, the first latch circuit including:
a pair of input transistors each having a gate thereof configured to connect to a signal line to which a first voltage is supplied; and
a pair of output nodes,
the first latch circuit configured to receive the single-phase clock signal; and
a second latch circuit of SR-type, the second latch circuit having a set input thereof configured to connect to one output node of the pair of output nodes, having a reset input thereof configured to connect to the other output node of the pair of output nodes, and configured to output the differential clock signals of which frequency is half the frequency of the single-phase clock signal, and
the first latch circuit is configured to perform amplification and reset operations alternately repeatedly in response to the single-phase clock signal, and configured not to reset nodes to which drains of the pair of input transistors are connected in the reset operation.

8. The communication circuit according to claim 7, further comprising:
a reception processing circuit, the reception processing circuit including:
a demultiplexer configured to use the differential clock signals supplied from the frequency divider circuit and convert a serial signal into a parallel signal,
the reception processing circuit configured to convert a received serial signal into a parallel signal and outputs the parallel signal.

9. The communication circuit according to claim 7, wherein
the first latch circuit includes a pair of inverters which are cross-connected, each of the pair of inverters including two transistors, a source of one transistor of the two transistors being connected to a drain of the input transistor, and
the pair of output nodes are connected to outputs of the pair of inverters, and the first latch circuit is configured to reset the pair of output nodes in the reset operation.

10. The communication circuit according to claim 7, wherein
the first latch circuit is a strong arm type latch circuit.

11. A communication circuit, comprising:
a frequency divider circuit configured to receive a single-phase clock signal and output differential clock signals of which frequency is half a frequency of the single-phase clock signal; and
a reception processing circuit, the reception processing circuit including:
a demultiplexer configured to use the differential clock signals supplied from the frequency divider circuit and convert a serial signal into a parallel signal,
the reception processing circuit configured to convert a received serial signal into a parallel signal and output the parallel signal, wherein
the frequency divider circuit includes:
a first latch circuit, the first latch circuit including:
a pair of input transistors each having a gate thereof configured to connect to a signal line to which a first voltage is supplied; and
a pair of output nodes,
the first latch circuit configured to receive the single-phase clock signal; and
a second latch circuit of SR-type, the second latch circuit having a set input thereof configured to connect to one output node of the pair of output nodes, having a reset input thereof configured to connect to the other output node of the pair of output nodes, and configured to output the differential clock signals of which frequency is half the frequency of the single-phase clock signal, and
the first latch circuit is configured to perform amplification and reset operations alternately repeatedly in response to the single-phase clock signal, and configured not to reset nodes to which drains of the pair of input transistors are connected in the reset operation.

12. The communication circuit according to claim 11, wherein
the first latch circuit includes a pair of inverters which are cross-connected, each of the pair of inverters including two transistors, a source of one transistor of the two transistors being connected to a drain of the input transistor, and
the pair of output nodes are connected to outputs of the pair of inverters, and the first latch circuit is configured to reset the pair of output nodes in the reset operation.

13. The communication circuit according to claim 11, wherein
the first latch circuit is a strong arm type latch circuit.

14. An integrated circuit, comprising:
a frequency divider circuit configured to receive a single-phase clock signal and output differential clock signals of which frequency is half a frequency of the single-phase clock signal;
a transmission processing circuit, the transmission processing circuit including:
a multiplexer configured to use the differential clock signals supplied from the frequency dividing circuit and convert a parallel signal into a serial signal,
the transmission processing circuit configured to convert an input parallel signal into a serial signal and transmits the serial signal; and
a first signal processing circuit configured to perform processing relating to the parallel signal output to the transmission processing circuit, wherein
the frequency divider circuit includes:
a first latch circuit, the first latch circuit including:
a pair of input transistors each having a gate thereof configured to connect to a signal line to which a first voltage is supplied; and
a pair of output nodes,
the first latch circuit configured to receive the single-phase clock signal; and
a second latch circuit of SR-type, the second latch circuit having a set input thereof configured to connect to one output node of the pair of output nodes, having a reset input thereof configured to connect to the other output node of the pair of output nodes, and configured to output the differential clock signals of which frequency is half the frequency of the single-phase clock signal, and
the first latch circuit is configured to perform amplification and reset operations alternately repeatedly in response to the single-phase clock signal, and configured not to reset nodes to which drains of the pair of input transistors are connected in the reset operation.

15. The integrated circuit according to claim 14, further comprising:
a reception processing circuit, the reception processing circuit including:
a demultiplexer configured to use the differential clock signals supplied from the frequency divider circuit and convert a serial signal into a parallel signal,
the reception processing circuit configured to Convert a received serial signal into a parallel signal and output the parallel signal; and
a second signal processing circuit configured to perform a processing operation in response to reception of the parallel signal output from the reception processing circuit.

16. The integrated circuit according to claim 14, wherein
the first latch circuit: includes a pair of inverters which are cross-connected, each of the pair of inverters including two transistors, a source of one transistor of the two transistors being connected to a drain of the input transistor, and
the pair of output nodes are connected to outputs of the pair of inverters, and the first latch circuit is configured to reset the pair of output nodes in the reset operation.

17. The integrated circuit according to claim 14, wherein
the first latch circuit is a strong arm type latch circuit.

18. An integrated circuit, comprising:
a frequency divider circuit configured to receive a single-phase clock signal and output differential clock signals of which frequency half a frequency of the single-phase clock signal;
a reception processing circuit, the reception processing circuit including:
   a demultiplexer configured to use the differential clock signals supplied from the frequency dividing circuit and convert a serial signal into a parallel signal,
the reception processing circuit configured to convert a received serial signal into a parallel signal and output the parallel signal; and
a second signal processing circuit configured to perform a processing operation in response to reception of the parallel signal output from the reception processing circuit, wherein
the frequency divider circuit including:
a first latch circuit, the first latch circuit including:
   a pair of input transistors each having a gate thereof configured to connect to a signal line to which a first voltage is supplied; and
   a pair of output nodes,
the first latch circuit configured to receive the single-phase clock signal; and
a second latch circuit of SR-type, the second latch circuit having a set input thereof configured to connect to one output node of the pair, of output nodes, having a reset input thereof configured to connect to the other output node of the pair of output nodes, and configured to output the differential clock signals of which frequency is half the frequency of the single-phase clock signal, and
the first latch circuit is configured to perform amplification and reset operations alternately repeatedly in response to the single-phase clock signal, and configured not to reset nodes to which drains of the pair of input transistors are connected in the reset operation.

19. The integrated circuit according to claim 18, wherein
the first latch circuit includes a pair of inverters which are cross-connected, each of the pair of inverters including two transistors, a source of one transistor of the two transistors being connected to a drain of the input transistor, and
the pair of output nodes are connected to outputs of the pair of inverters, and the first latch circuit is configured to reset the pair of output nodes in the reset operation.

20. The integrated circuit according to claim 18, wherein the first latch circuit is a strong arm type latch circuit.

* * * * *